United States Patent
Kim (10) Patent No.: US 6,580,620 B1
(45) Date of Patent: Jun. 17, 2003

(54) MATRIX TYPE PRINTED CIRCUIT BOARD FOR SEMICONDUCTOR PACKAGES

(75) Inventor: SungJin Kim, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/548,705

(22) Filed: Apr. 13, 2000

(30) Foreign Application Priority Data

Apr. 14, 1999 (KR) ............................................. 99-06093

(51) Int. Cl.[7] ................................................. H05R 1/14
(52) U.S. Cl. ........................ 361/784; 361/760; 361/783; 257/787
(58) Field of Search ................................. 361/748, 760, 361/783–784, 805; 174/250, 255, 260–261; 257/666–667, 678, 787; 438/107–113

(56) References Cited

U.S. PATENT DOCUMENTS

| | | | |
|---|---|---|---|
| 5,635,671 A | * 6/1997 | Freyman et al. | 174/52.2 |
| 5,645,864 A | * 7/1997 | Higuchi | 264/272.17 |
| 5,905,633 A | * 5/1999 | Shim et al. | 361/704 |
| 5,929,511 A | * 7/1999 | Nakazawa et al. | 257/666 |
| 5,981,873 A | * 11/1999 | Heo | 174/52.2 |
| 6,239,380 B1 | * 5/2001 | Drussel et al. | 174/250 |
| 6,309,916 B1 | * 10/2001 | Crowley et al. | 438/127 |
| 6,469,258 B1 | * 10/2002 | Lee et al. | 174/261 |

* cited by examiner

*Primary Examiner*—Albert W. Paladini
*Assistant Examiner*—Tuan Dinh
(74) *Attorney, Agent, or Firm*—Bever, Hoffman & Harms; James E. Parsons (57) ABSTRACT

Disclosed is a matrix type printed circuit board (PCB) for semiconductor packages having a structure including a plurality of PCB units arranged in a matrix array having at least two rows in such a fashion that the mold runner gates of adjacent PCB units respectively arranged in adjacent rows while being arranged in the same column communicate with each other by an integrate mold runner, thereby being capable of allowing an increased number of PCB units to be simultaneously processed in each process involved in the fabrication of semiconductor packages, so that a great improvement in productivity is achieved. In particular, it is possible to allow an increased number of PCB units to be simultaneously molded in a resin encapsulate molding process, thereby achieving a great improvement in the efficiency of the resin encapsulate molding process. Furthermore, surplus encapsulating resin materials cured in the mold runner gates and integrate mold runners can be easily and reliably removed in accordance with a degating and/or deculling process without a surface damage of the PCB. It is also possible to achieve an easy open/short circuit test for individual PCBs.

30 Claims, 8 Drawing Sheets

MATRIX TYPE PRINTED CIRCUIT BOARD FOR SEMICONDUCTOR PACKAGES

BACKGROUND OF THE INVENTION

1. Field of the Invention

The present invention relates to a method for reproducing a printed circuit board (PCB) for semiconductor packages, and more particularly to a matrix type PCB for semiconductor packages having a structure including a plurality of PCB units arranged in a matrix array having at least two rows in such a fashion that the mold runner gates of adjacent PCB units respectively arranged in adjacent rows while being arranged in the same column communicate with each other by an integrate mold runner, thereby being capable of allowing an increased number of PCB units to be simultaneously processed in each process involved in the fabrication of semiconductor packages, so that a great improvement in productivity is achieved.

2. Description of the Prior Art

Generally, a PCB is a circuit board adapted to transmit electrical signals from a semiconductor chip mounted thereon to an external unit and from the external unit to the semiconductor chip. Such a PCB is fabricated by laminating conductive thin films over upper and lower surfaces of a resin substrate made of a glass fiber reinforced thermosetting resin composite, patterning the conductive thin films in accordance with well-known photolithography processes, thereby forming circuit patterns on the upper and lower surfaces of the resin substrate, electrically connecting those circuit patterns to each other by via holes, and coating solder masks, made of a polymer resin, on the upper and lower surfaces of the resin substrate at desired regions, respectively.

The PCB having the above mentioned structure is called a "single-layer PCB". Recently, a multi-layer PCB has been proposed which is formed by laminating a plurality of single-layer PCB structures, each having a resin substrate and a pair of conductive circuit patterns, to form a multi-layer PCB structure. In such a multi-layer PCB structure, adjacent conductive circuits of adjacent layers are electrically connected by conductive via holes.

Figure 1:
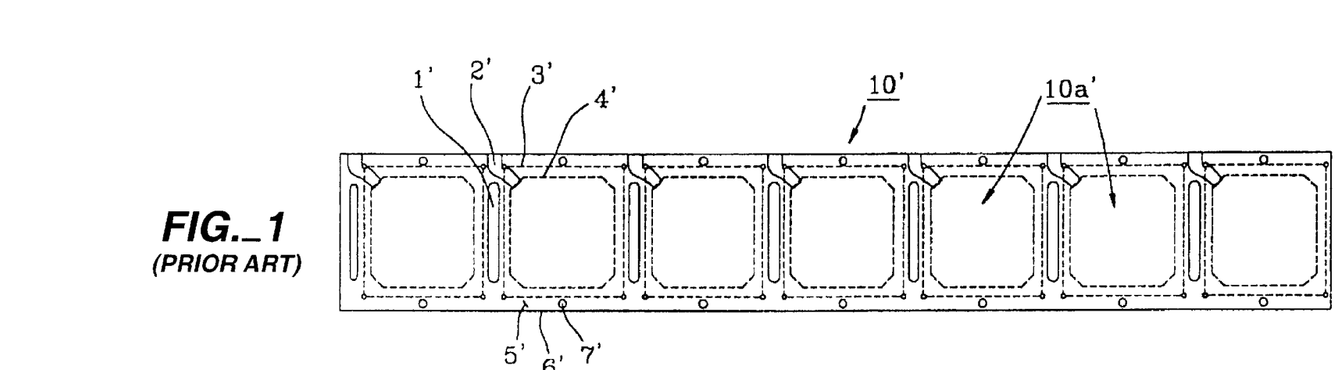
FIG. 1 is a plan view schematically illustrating a conventional PCB strip for semiconductor packages.

Referring to FIG. 1, a conventional PCB strip having the above mentioned structure is schematically illustrated.

As shown in FIG. 1, the PCB strip, which is denoted by the reference numeral 10', includes a resin substrate 6' having a rectangular strip shape. A plurality of conductive circuit patterns (not shown) are formed on each of upper and lower surfaces of the resin substrate 6'. Solder masks 5' are also formed on the upper and lower surfaces of the resin substrate 6', respectively, in order to protect the conductive circuit patterns formed on the upper and lower surface of the resin substrate 6' from the surrounding environment while preventing those conductive circuit patterns from being short-circuited. A plurality of mold runner gates 2' are formed on the upper surface of the resin substrate 6'. Each mold runner gate 2' is arranged at one corner of a region corresponding to one of PCB units 10a' longitudinally aligned with one another along the PCB strip in the form of a strip. Each mold runner gate 2' is plated with gold (Au) or palladium and adapted to guide a melted encapsulating resin of high temperature and high pressure to a resin encapsulation region defined on an associated one of the PCB units 10a'. The resin encapsulation region of each PCB unit 10a' is defined by a resin encapsulation line 4'. The melted encapsulating resin is introduced into the resin encapsulation region of each PCB units 10a' through an associated one of the mold runner gates 2', and then cured, thereby forming a resin encapsulate encapsulating a semiconductor chip mounted on the PCB unit 10a' along with bonding wires. After the formation of the resin encapsulates, the surplus encapsulating resin cured in each mold runner gate 2' serving as a resin introduction passage is subjected to a degating or deculling process so that it is removed. Since the gold or palladium coated over the mold runner gates 2' exhibits a bonding force to the encapsulating resin considerably lower than the bonding force to the resin substrate or the solder mask, the surplus encapsulating resin cured in each mold runner gate 2' can be easily removed without causing the solder mask and circuit patterns to be damaged.

For the formation of the resin encapsulates, an upper mold and a lower mold (not shown) are used which are engaged with each other. At the region defined by the resin encapsulation line 4' in each PCB unit 10a', an associated one of cavities defined in the upper mold is arranged. The melted encapsulating resin fills each cavity, and is then cured, thereby forming a resin encapsulate. In FIG. 1, the reference numeral 3' denotes package unit singulation lines along which the PCB strip 10' is cut into individual semiconductor packages respectively corresponding to the PCB units after the resin encapsulate formation so that those semiconductor packages are separated from one another.

A plurality of spaced pin holes 7' are formed at each longitudinal edge of the PCB strip 10' in order to allow an easy feeding of the PCB strip 10' between adjacent processes.

The conductive circuit patterns of adjacent PCB units 10a' in the PCB strip 10' are electrically connected. Accordingly, the electroplating process for the conductive circuit patterns of all PCB units 10a' can be conducted in a single pass. After the completion of the electroplating process, slots 1' are perforated through respective portions of the PCB strip 10' where the conductive circuit patterns of adjacent PCB units 10a' are electrically connected, thereby causing those conductive circuit patterns to be disconnected. As a result, it is possible to easily conduct an open/short circuit test for each PCB unit 10a'. It is also possible to prevent the PCB strip 10' from being bent due to a thermal expansion coefficient difference between the resin substrate 6' and the circuit patterns when being subjected to high temperature processes conducted in the fabrication of semiconductor packages.

However, the above mentioned conventional PCB strip 10' has a problem in that there is a great limitation on the number of semiconductor packages fabricated from one PCB strip. For instance, only seven semiconductor packages can be fabricated from the PCB strip shown in FIG. 1. Although active attempts have been made in a variety of fields associated with the fabrication of semiconductor packages to reduce the manufacturing costs, there is a limitation on the reduction of manufacturing costs insofar as the PCB strip 10' having the above mentioned structure is used. The above mentioned PCB strip structure also involves a problem of a low productivity in that there is a great limitation on the number of PCB units processed per process in the fabrication of semiconductor packages.

SUMMARY OF THE INVENTION

An object of the present invention is to provide a matrix type PCB for semiconductor packages having a structure capable of allowing an increased number of PCB units to be simultaneously processed in each process involved in the fabrication of semiconductor packages, thereby achieving a great improvement in productivity.

A second object of the invention is to provide a matrix type PCB for semiconductor packages having a structure capable of allowing an increased number of PCB units to be simultaneously molded in a resin encapsulate molding process, thereby achieving a great improvement in the efficiency of the resin encapsulate molding process.

A third object of the invention is to provide a matrix type PCB for semiconductor packages having a structure capable of easily and reliably removing surplus encapsulating resin materials cured in mold runner gates and integrate mold runners in accordance with a degating and/or deculling process without surface damage to the PCB.

A fourth object of the invention is to provide a matrix type PCB for semiconductor packages having a structure capable of allowing an easy open/short circuit test for individual PCBs.

In accordance with the present invention, the first and second objects are accomplished by providing a matrix type printed circuit board for semiconductor packages comprising: a resin substrate having a rectangular shape provided with two parallel longer edges and two parallel shorter edges; a plurality of printed circuit board (PCB) units formed on at least one surface of the resin substrate and arranged in a matrix array having at least two rows, each of the PCB units having a semiconductor chip mounting region at a central portion thereof; a plurality of first mold runner gates each formed at one corner of an associated one of the PCB units included in a first one of the at least two rows arranged adjacent to a first one of the longer edges of the resin substrate, the one corner being arranged adjacent to the first longer edge of the resin substrate; a plurality of second mold runner gates each formed at one corner of an associated one of the PCB units included in a second one of the at least two rows arranged adjacent to the first-row PCB units, the one corner of each PCB unit included in the second row being arranged nearest to the first mold runner gate of an associated one of the PCB units arranged in the first row and in the same column as the second-row PCB unit; and a plurality of first integrate mold runners each extending straight between the first and second mold runner gates of adjacent ones of the PCB units respectively arranged in the first and second rows while being arranged in the same column.

In accordance with one aspect of the present invention for accomplishing the third object, the matrix type printed circuit board, which has a configuration capable of accomplishing the first and second objects, has a configuration including a through hole formed at each of the second mold runner gates and provided with a plated inner wall surface or a deculling dummy pattern formed at each of the first integrate mold runners.

In accordance with another aspect of the present invention for accomplishing the fourth object, the matrix type printed circuit board, which has a configuration capable of accomplishing the first and second objects, has a configuration including a slit perforated through a solder mask opening region where a conductive bus line is arranged while extending in parallel to an associated one of the first integrate mold runners, the slit serving to electrically disconnect conductive traces, extending across the conductive bus line, from one another.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE EMBODIMENTS

Figure 2:
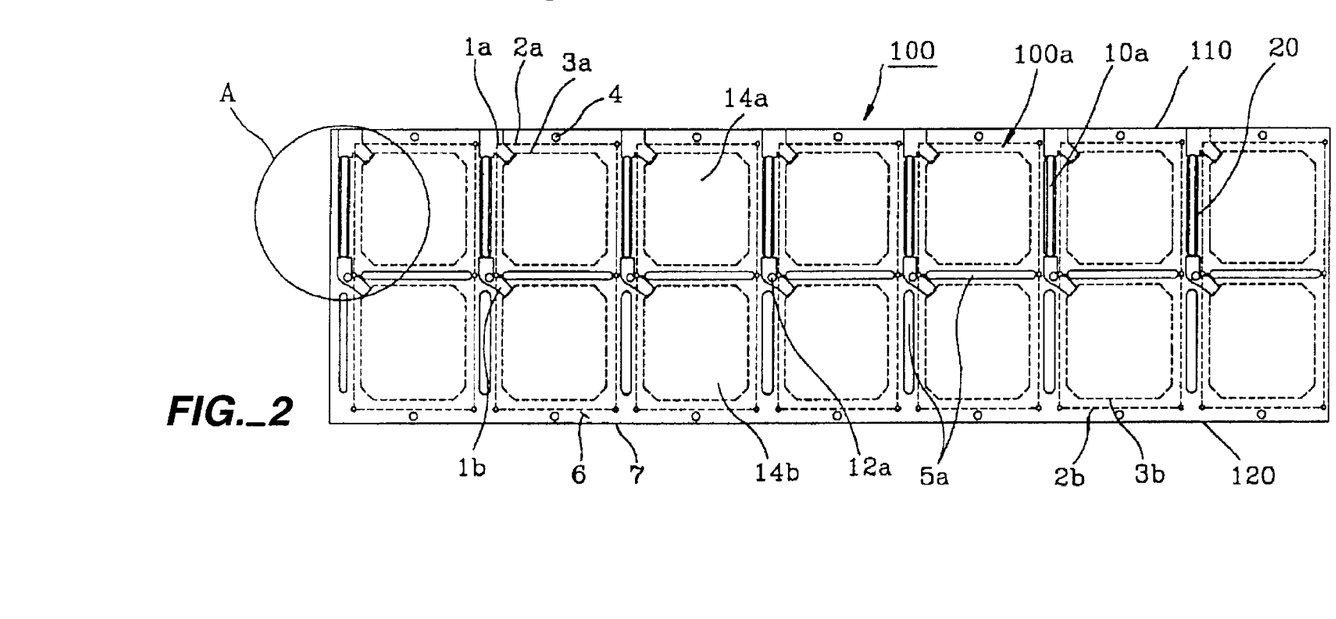
FIG. 2 is a plan view schematically illustrating a matrix type PCB for semiconductor packages according to an embodiment of the present invention.

FIG. 2 is a schematic plan view illustrating a matrix type PCB according to an embodiment of the present invention. As shown in FIG. 2, the matrix type PCB, which is denoted by the reference numeral 100, is configured to have a plurality of PCB units 100a arranged in a matrix array having at least two rows. In the illustrated case, the PCB 100 has only two PCB unit rows 110 and 120. However, the present invention is not limited to the PCB having only two PCB unit rows. In accordance with the present invention, the PCB 100 may have three, four or more PCB unit rows in so far as a mold runner extends between adjacent mold runner gates of adjacent PCB unit rows.

As shown in FIG. 2, the PCB 100 includes a resin substrate 7 having a rectangular shape provided with two parallel longer edges and two parallel shorter edges. Although not shown, circuit patterns are formed on the upper surface or both the upper and lower surfaces of the resin substrate 7.

The circuit patterns have the form of repetitive units respectively corresponding to each of the PCB units 100a. Each circuit pattern unit, which is defined by a package singulation line 2a or 2b, has a central semiconductor chip mounting region (not shown), and a plurality of uniformly spaced conductive (e.g., metal) traces (not shown) extending radially or outwardly from each edge of the semiconductor chip mounting region. Where the circuit patterns are formed on both the upper and lower surfaces of the resin substrate 7, each conductive trace on the upper surface of the resin substrate 7 is electrically connected to an associated one of the conductive traces on the lower surface of the resin substrate 7 by a conductive via hole (not shown).

A slot 5a is formed between adjacent PCB units 100a in order to prevent the PCB 100 from being bent in high temperature processes or to allow the PCB 100 to be easily cut into individual PCB units 100a after the formation of semiconductor packages for those PCB units 100a. The PCB 100 is provided with a plurality of uniformly spaced pin holes 4 at a region arranged adjacent to each longer edge thereof. The pin holes 4 are used for feeding the PCB 100 in the various processes.

First mold runner gates 1a are formed at each of the PCB units 100a included in the first PCB unit row 110 of the PCB 100. Each mold runner gate 1a is arranged at one corner of an associated one of the first-row PCB units 100a adjacent to one longer edge of the PCB 100.

Second mold runner gates 1b are formed at each of the PCB units 100a included in the second PCB unit row 120 of the PCB 100. Each mold runner gate 1b is arranged at one corner of an associated one of the second-row PCB units 100a. In particular, each mold runner gate 1b is located at the corner nearest to the first mold runner gate 1a of the first-row PCB unit 100a that is in the same column as the second-row PCB unit 100a.

The first and second mold runner gates 1a and 1b serve to guide a melted encapsulating resin to resin encapsulation regions each defined on an associated one of the PCB units 100a in a molding process. Before the melted encapsulating resin is introduced into each resin encapsulation region, a semiconductor chip is mounted on the central semiconductor chip mounting region (not shown) of each circuit pattern unit (not shown). A wire bonding process or other interconnect process is also conducted to electrically connect the semiconductor chip to the circuit pattern of the circuit pattern unit.

Each mold runner gate 1a or 1b is comprised of a thin metal film that exhibits a relatively low bonding force to the encapsulating resin. For example, the mold runner gates 1a and 1b may be made of gold, platinum, palladium, silver, or an alloy thereof.

The encapsulating resin entering the first and second mold runner gates 1a and 1b fills in resin encapsulation regions 14a and 14b, respectively, and then is cured, thereby forming resin encapsulates adapted to protect semiconductor chips and conductive wires mounted on the PCB unit 100a from the surrounding environment. After the formation of a resin encapsulate at each region 14a and 14b of each PCB unit 100a, that is, within respective cavities defined in an upper mold used in a resin encapsulating process, the surplus encapsulating resin left in each mold runner gate 1a or 1b is removed. Since the mold runner gates 1a and 1b are made of the above mentioned metal, the surplus encapsulating resin cured in each mold runner gate 1a or 1b can be easily removed.

Figure 3:
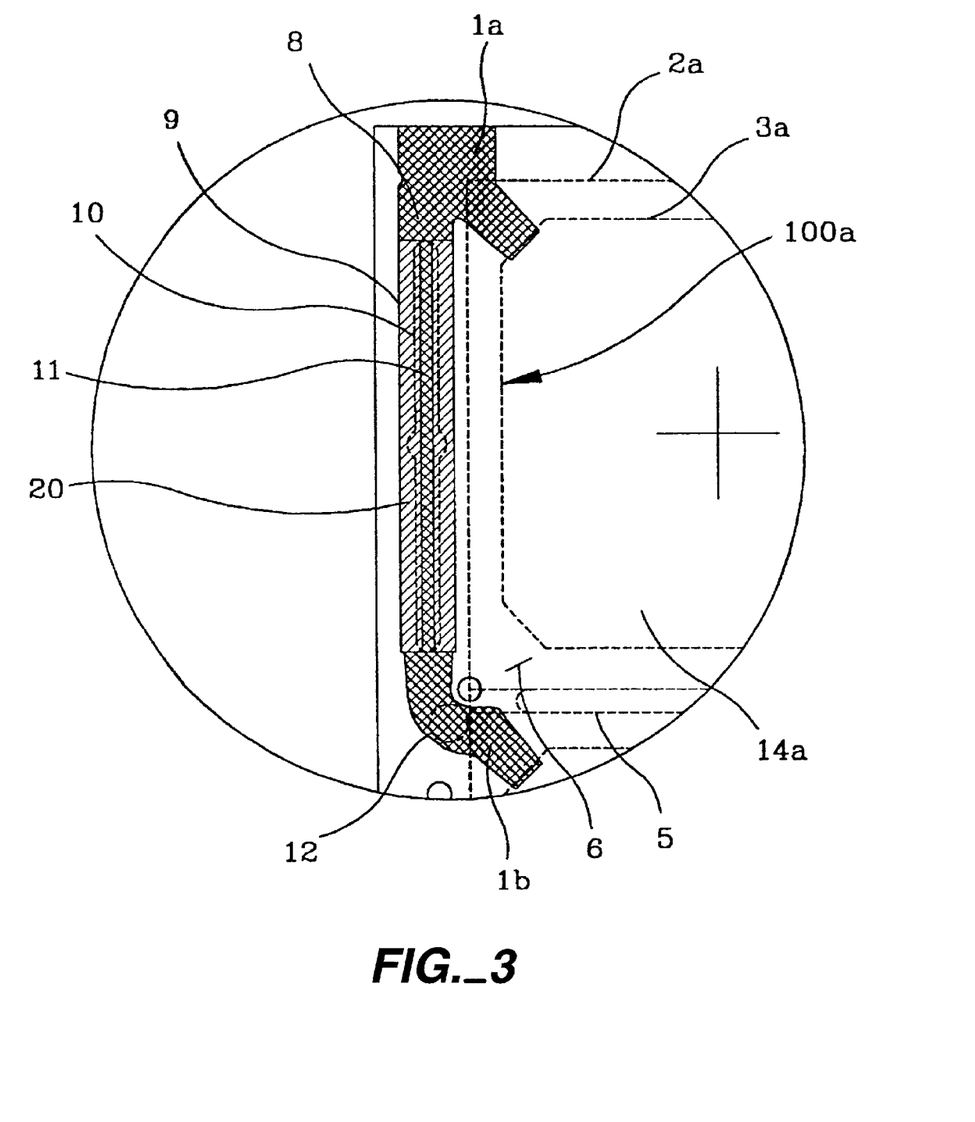
FIG. 3 is an enlarged plan view corresponding to a portion A of FIG. 2, illustrating an integrate mold runner formed between first and second mold runner gates prior to the formation of a slit.

Each mold runner gate 1a or 1b has one end extending from one corner of the associated PCB unit 100a to the resin encapsulation line 3a or 3b of the PCB unit 10a. The other end of each first mold runner gate 1a communicates with a mold runner (not shown) which is defined in a mold (not shown) as a passage for introducing a melted encapsulating resin into the mold. As shown in FIG. 3, each second mold runner gate 1b has an S shape, though it is not limited to that shape.

Figure 8:
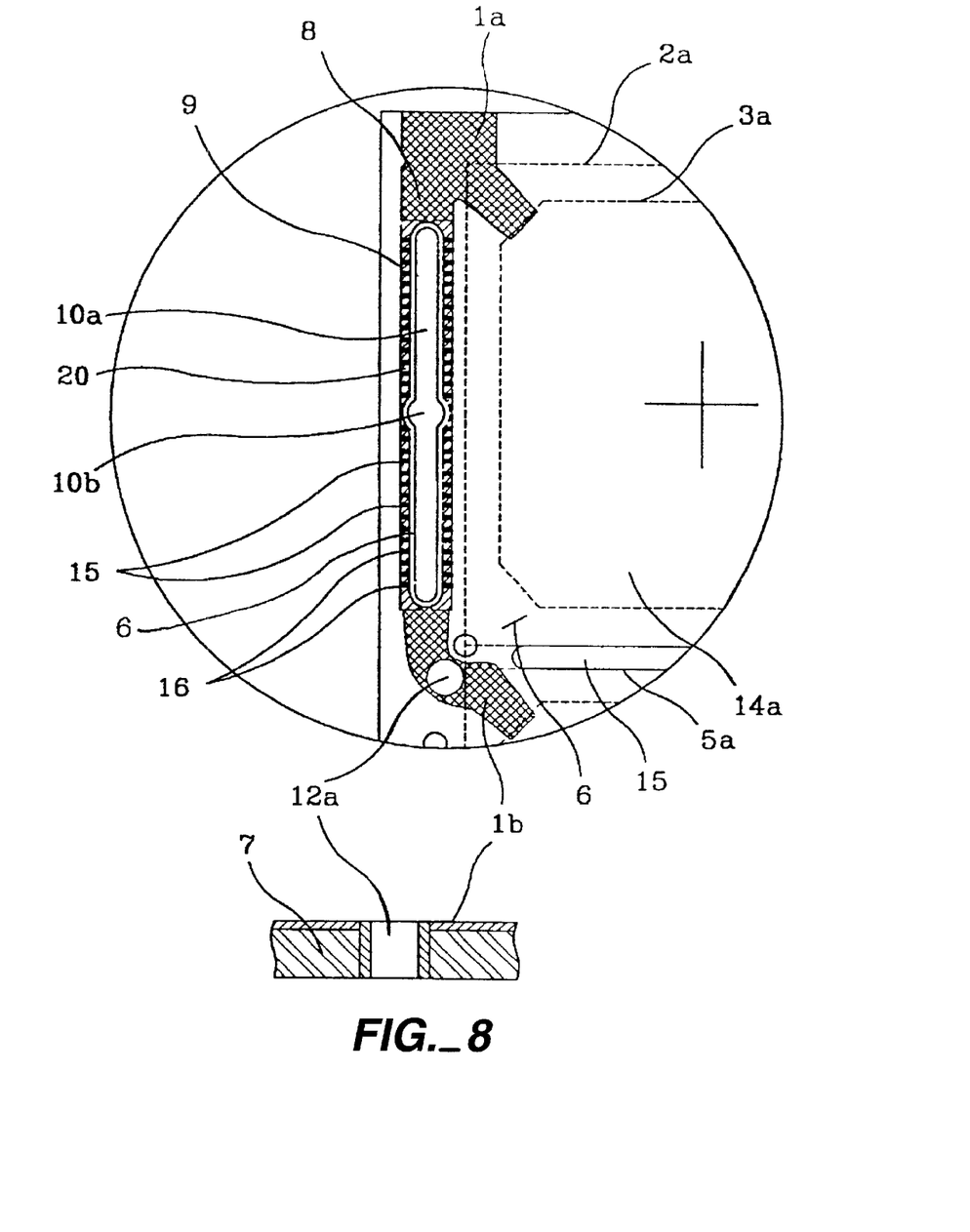
FIG. 8 is a plan view illustrating a structure for one PCB unit obtained after forming a slit in the structure of FIG. 5 or to remove a conductive bus line and after forming a plated through hole at the second mold runner gate.

Referring again to FIG. 2, an integrate mold runner 20 is formed on each PCB unit 100a between the first mold runner gate 1a of the PCB unit 100a and the second mold runner gate 1b associated with the first mold runner gate 1a of the same column. The integrate mold runner 20 serves to allow the encapsulating resin introduced through the first mold runner gate 1a to be also introduced into the second mold runner gate 1b. Accordingly, all the PCB units 100a arranged on the first and second PCB unit rows 110 and 120 can be simultaneously molded in a single molding process. A slit 10a is formed at a region where each integrate mold runner 20 is arranged, as best shown in FIG. 8. The integrate mold runner region is coated with no solder mask.

In FIG. 2, a solder mask 6 comprised of a resin insulating 1a yer is coated over the entire circuit pattern of the PCB 100, except for the integrate mold runner regions and semiconductor chip mounting regions, in order to protect the circuit patterns while preventing the conductive traces from being short-circuited with one another.

FIG. 3 is an enlarged plan view corresponding to a portion A of FIG. 2, illustrating one integrate mold runner 20 formed between the associated first and second mold runner gates 1a and 1b prior to the formation of the slit 10a (see FIG. 8). In FIG. 3, no conductive circuit pattern is shown. In the following description made in conjunction with FIG. 3, the elements described in conjunction with FIG. 2 will not be further described.

As shown in FIG. 3, a conductive bus line 11 is formed at a region where each integrate mold runner 20 is arranged. The conductive bus line 11 serves to electrically connect a gate connection part 8 of the associated first mold runner gate 1a to the associated second mold runner gate 1b. Gate connection parts 8 are branches of first mold runner gates 1a that facilitate coupling to second mold runner gates 1b. Thus, all the circuit patterns of the first and second PCB unit rows 110 and 120 are electrically connected together. The reason why all the circuit patterns of the first and second PCB unit rows 110 and 120 are to be electrically connected together is to easily and simultaneously achieve the plating process for all circuit patterns. The coating of the solder mask 6 is conducted after the completion of the plating process. The slots 5a (FIG. 8) and slits 10a (FIG. 8) are perforated after the coating of the solder mask 6 in accordance with a punching or routing process in order to release the electrical connection of the circuit patterns. Thus, the PCB 100 has a structure usable for the fabrication of semiconductor packages.

In FIG. 3, the reference numeral 12 denotes a selective through hole forming line indicated by a phantom circle and arranged in each second mold runner gate 1b at a region just adjacent to and outside the associated PCB unit 100a. As shown in FIG. 3, the selective through hole forming line 12 is arranged at a substantially central portion of the second mold runner gate 1b. In FIG. 3, the reference numeral 10 denotes a slit forming line. In FIG. 3, the reference numeral 5 denotes a slot forming line.

Figure 4:
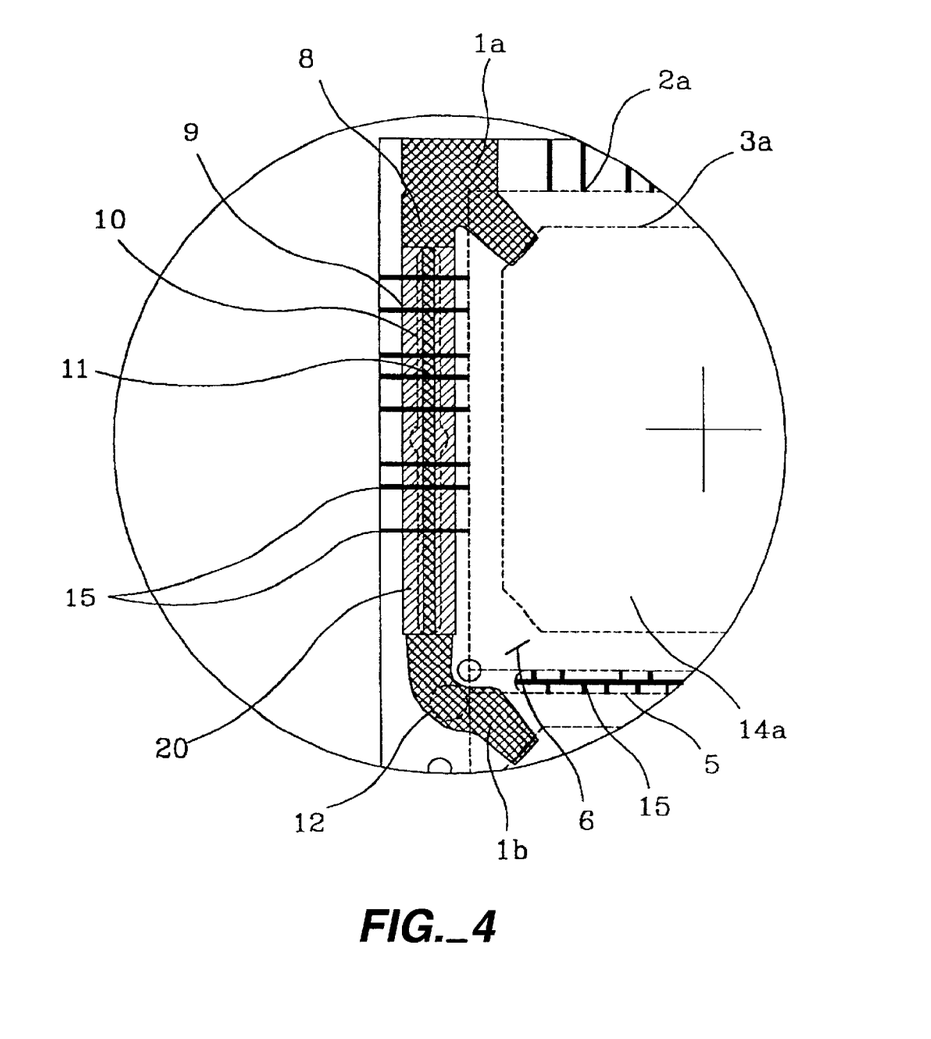
FIG. 4 is an enlarged plan view illustrating conductive traces formed in such a fashion that they cross the integrate mold runner shown in FIG. 3.

FIG. 4 is an enlarged plan view illustrating conductive traces 15 formed in such a fashion that they cross the integrate mold runner 20 shown in FIG. 3. FIG. 4 shows the same elements as those shown in FIG. 3, except that the circuit pattern of the PCB unit 100a, including the conductive traces 15, is shown in an exposed state at outer regions, covered by the solder mask 6, other than a solder mask opening region 9 for the best understanding of the present invention. Accordingly, the following description will be made only for the conductive traces 15.

The conductive traces 15 of each PCB unit 100a extend from the associated conductive circuit pattern (not shown) to the associated outer edge of the PCB unit 100a. That is, the conductive traces 15 arranged between adjacent PCB units 100a extend between the conductive circuit patterns of those PCB units 100a. The conductive traces 15 arranged at the longer or shorter edge of the PCB 100 extends from the associated conductive circuit pattern to the associated edge of the PCB 100. Thus, all PCB units 100*a* of the PCB 100 are electrically connected together. The conductive traces 15, which are arranged at each solder mask opening region 9 where one integrate mold runner 20 is arranged, extend across the conductive bus line 11 arranged in the solder mask opening region 9 and adapted to connect the associated first and second mold runner gates 1*a* and 1*b* to each other while contacting the conductive bus line 11, so that they are electrically connected together by the conductive bus line 11.

Figure 5:
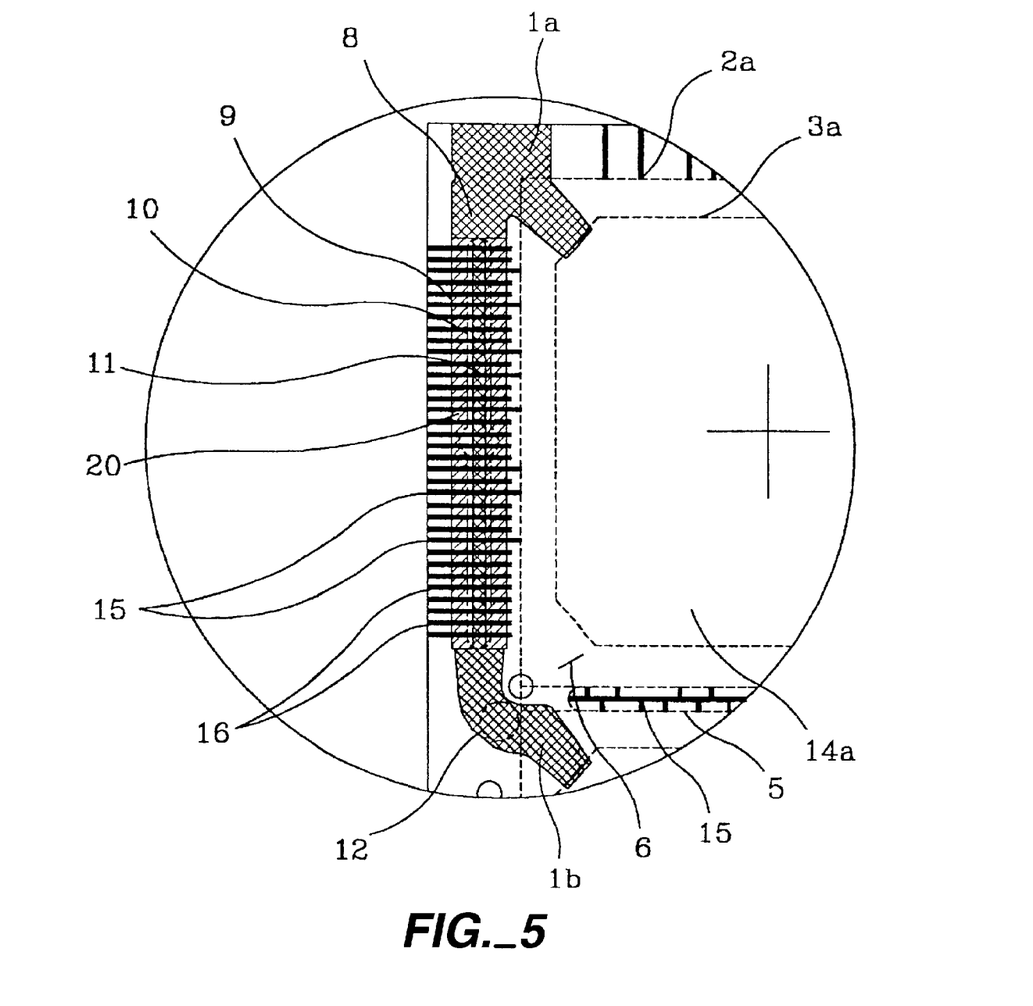
FIG. 5 is an enlarged plan view corresponding to portion A of FIG. 2, illustrating a structure obtained prior to the formation of the slit in accordance with another embodiment of the present invention.

FIG. 5 is an enlarged plan view corresponding to a portion A of FIG. 2, illustrating a structure obtained prior to the formation of the slit 10*a* (FIG. 8). The structure shown in FIG. 5 is the same as that of FIG. 4, except that dummy traces are formed and illustrated.

As shown in FIG. 5, dummy traces 16 are formed in the vicinity of the integrate mold runner region in each PCB unit 100*a* in order to allow the cured surplus encapsulating resin left at the integrate mold runner region to be easily removed in accordance with a deculling process after the formation of resin encapsulates. The dummy traces 16 may be made of copper or a copper alloy, as in the conductive traces 15. Gold may be plated over the upper surface of each dummy trace 16. When a cured encapsulating resin left on the solder mask 6 in a bonded state is removed in accordance with a deculling process, the solder mask 6 is likely to be open because it exhibits a very high bonding force to the encapsulating resin. Accordingly, the conductive traces 15 exposed through the open portion of the solder mask may be damaged. Furthermore, the flowability of the encapsulating resin introduced in the encapsulating process may be degraded. To this end, the integrate mold runner regions are not coated with the solder mask 6 in accordance with the present invention. Also, a dummy pattern consisting of dummy traces (or plains), such as the above mentioned dummy traces 16, is formed. By such configurations, it is possible not only to more easily and reliably conduct the deculling process, but also to obtain an improved flowability of the encapsulating resin in the molding process.

In the illustrated case, the dummy traces 16 of each PCB unit 100*a* have a straight shape extending across the integrate mold runner region. Dummy traces 16 do not extend within a region defined by the package singulation line 2*a* of the PCB unit 100*a*. The dummy traces 16 of each PCB unit 100*a* are located between each of the associated first and second mold runner gates 1*a* and 1*b* and between adjacent ones of the conductive traces 15 arranged between the respective first and second mold runner gates 1*a* and 1*b*. Moreover, dummy traces 16 are uniformly spaced apart from one another, so that they have a compact arrangement. In other words, the dummy traces 16 extend across each of the conductive bus lines 11 in parallel to the conductive traces 15 associated with the conductive bus line 11 between the first and second mold runner gates 1*a* and 1*b* associated with the conductive bus line 11 in such a fashion that each of the associated conductive traces 15 is interposed between adjacent ones of the dummy traces 16.

Figure 6:
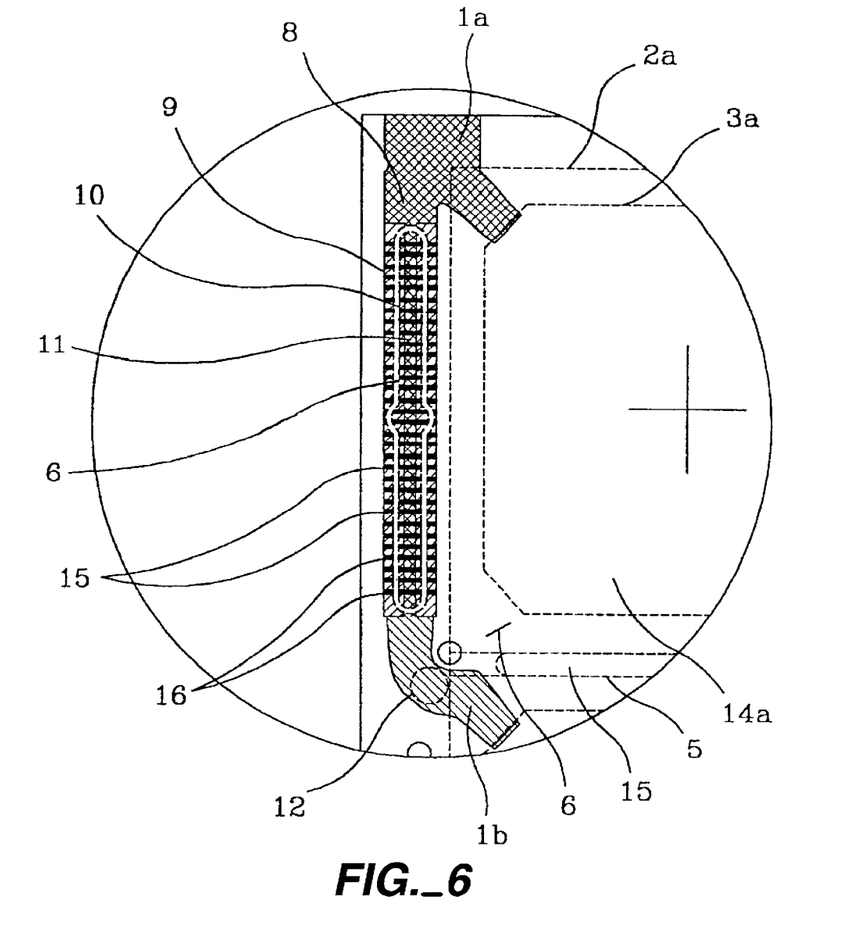
FIG. 6 is an enlarged plan view illustrating the structure of FIG. 5 coated with a solder mask.

FIG. 6 is an enlarged plan view illustrating a state in which the structure of FIG. 5 is coated with the solder mask 6. In the illustrated case, the solder mask 6 is arranged at a region defined outside the associated slit forming line 10 of each PCB unit 100*a* within the associated integrate mold runner region. By virtue of such an arrangement of the solder mask 6, it is possible to prevent the conductive traces 15 and/or dummy traces 16 from being deformed due to a force applied thereto upon perforating a slit (denoted by the reference numeral 10*a* in FIG. 8) along the slit forming line 10. Accordingly, it is possible to more efficiently prevent the conductive traces 15 and/or dummy traces 16 from rising upwardly or coming into contact with one another to generate a short circuit.

Figure 7A:
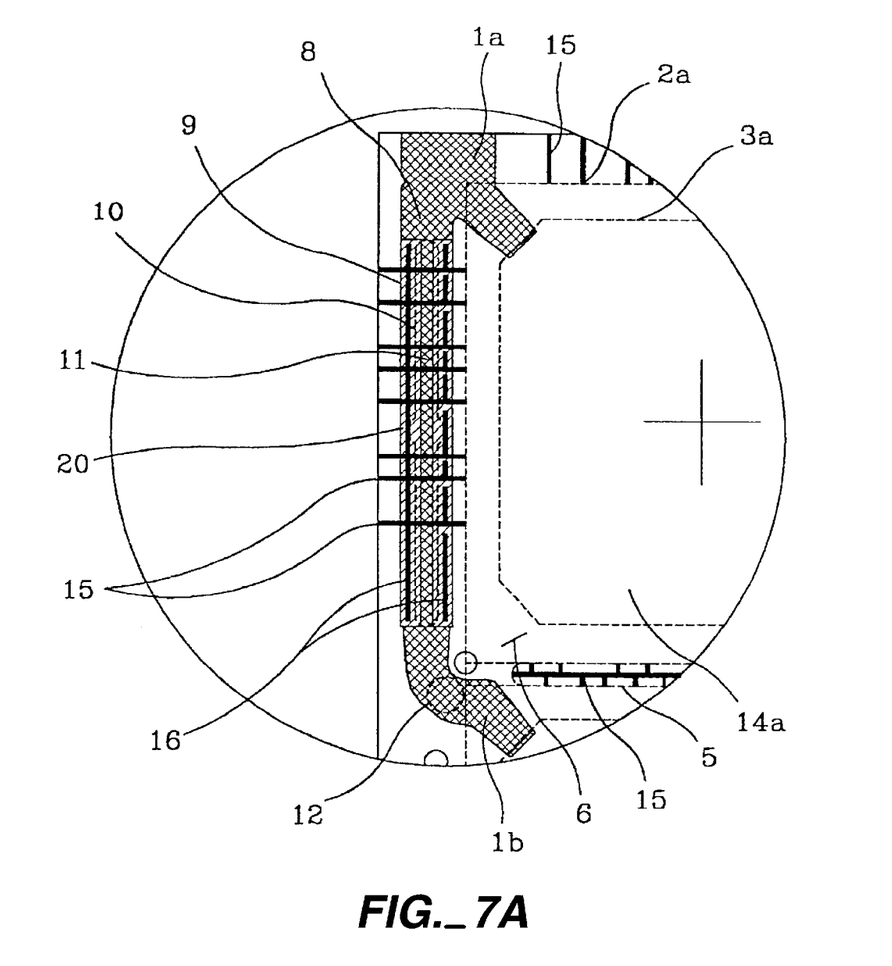
FIG. 7A is an enlarged plan view corresponding to the portion A of FIG. 2, illustrating a structure obtained prior to the formation of the slit in accordance with another embodiment of the present invention.

FIG. 7A is an enlarged plan view corresponding to the portion A of FIG. 2, illustrating a structure obtained prior to the formation of the slit 10*a* (FIG. 8). FIG. 7A shows another embodiment of the present invention in which a plurality of linear dummy traces 16 extend in parallel to the longitudinal direction of the integrate mold runner 20. For the convenience of illustration and description, the region, covered by the solder mask 6, other than the solder mask opening region 9 is shown in a partially exposed state. The basic structure shown in FIG. 7A is the same as that of FIG. 5. In the following description, accordingly, no description will be made in conjunction with the redundant structure.

In accordance with this embodiment, the dummy traces 16 are formed at the integrate mold runner region associated with each PCB unit 100*a* except for the region defined by the slit forming line 10, that is, at the region defined between the slit forming line 10 and the boundary of the integrate mold runner 20, while extending in the same direction as the extension direction of the integrate mold runner 20. The dummy traces 16 are arranged at least one side of the slit (denoted by the reference numeral 10*a* in FIG. 8) defined by the slit forming line 10. Preferably, the dummy traces 16 are arranged at both sides of the slit 10*a*. The dummy traces 16 of the one or both sides of slit 10*a* are arranged at regions defined between adjacent ones of the conductive traces 15 extending across the integrate mold runner and/or between the mold runner gate 1*a* or 1*b* and the conductive trace 15 arranged adjacent to the mold runner gate 1*a* or 1*b*, respectively. In other words, the dummy traces 16 extend in parallel to each of the conductive bus lines 11*b* between the first and second mold runner gates 1*a* and 1*b* associated with the conductive bus line 11 in such a fashion that each of the associated conductive traces 15 is interposed between adjacent ones of the dummy traces 16. Each of these dummy traces 16 should be prevented from being electrically connected to the associated conductive trace 15 or mold runner gate 1*a* or 1*b* at one end thereof. In this case, preferably, each dummy trace 16 is integrally connected to the associated conductive trace 16 or mold runner gate 1*a* or 1*b* at the other end thereof in order to avoid a deformation thereof in the deculling process.

On the other hand, since there is no PCB unit arranged outside the slit forming line 10 associated with each of the PCB units 100*a* respectively arranged adjacent to the shorter edges of the PCB 100, the dummy traces 16 associated with the edge-side PCB unit 100*a* may be connected together in the form of a single line crossing the conductive traces 15 extending across the integrate mold runner 20 associated with the edge-side PCB unit 100*a*. In this case, it is possible to more easily and reliably achieve the deculling process. In this case, the single line of the dummy traces 16 crossing the conductive traces 15 should be electrically disconnected from the mold runner gate 1*a* or 1*b*. The conductive traces 15 electrically connected by the single line of the dummy traces 16 are rendered to be electrically disconnected, after the formation of the slit (denoted by the reference numeral 10*a* in FIG. 8) perforated along the slit forming line 10, at the right side of the slit.

Where the dummy traces 16 are formed in such a fashion that they extend in the same direction as the extension direction of the integrate mold runner 20, the entire length thereof can be reduced. Accordingly, it is possible to reduce the plated amount of gold and the resistance to the flow of the encapsulating resin in the encapsulating process.

Figure 7B:
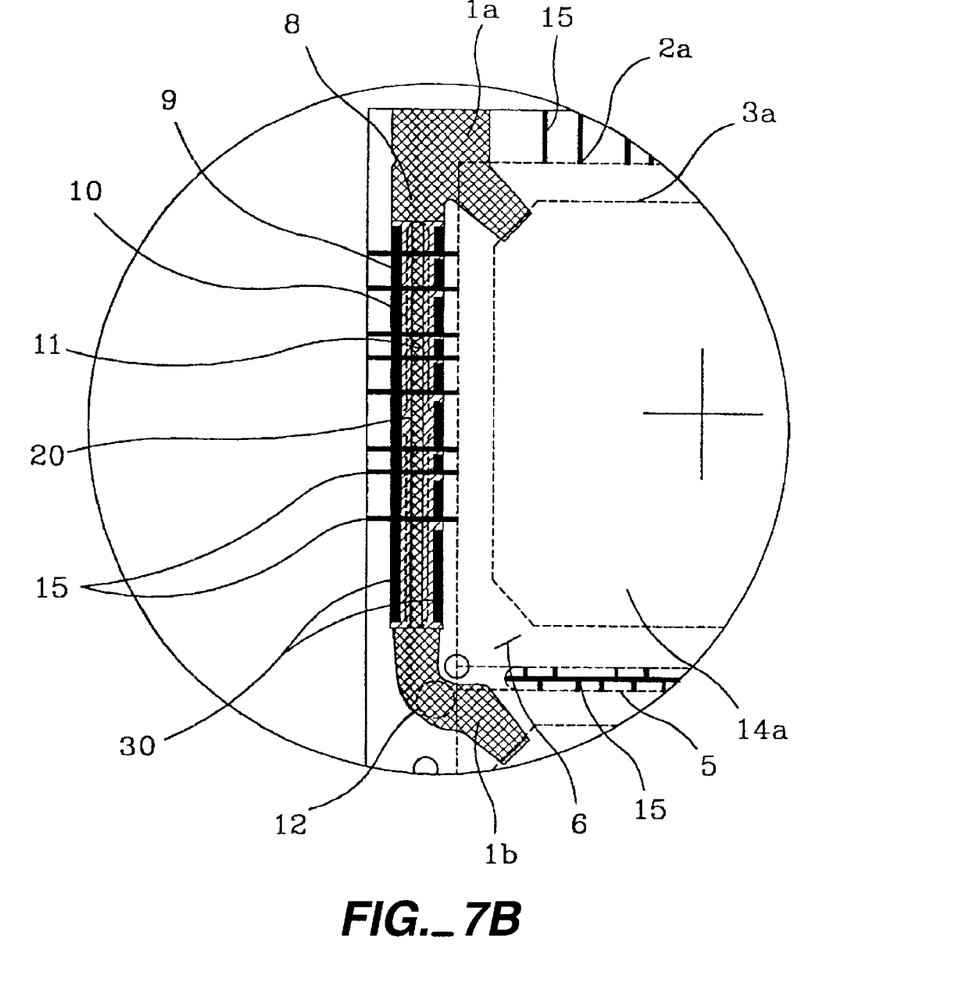
FIG. 7B is an enlarged plan view similar to FIG. 7A, illustrating another embodiment of the present invention in which dummy plains are used as a dummy pattern, in place of the dummy traces of FIG. 7A.

FIG. 7B illustrates the same structure as that of FIG. 7A, except that dummy plains 30 are used, as a dummy pattern, in place of the dummy traces 16. In the following description, accordingly, no description will be made in conjunction with the redundant structure. Similar to the case of FIG. 7A, the dummy plains 30 are arranged at a region defined between the slit forming line 10 and the boundary of the integrate mold runner 20, that is, the solder mask opening region 9.

Although the dummy pattern has been described as comprising the dummy traces 16 of FIG. 7A or the dummy plains 30 of FIG. 7B, it may comprise a combination of those dummy traces and dummy plains. Of course, the dummy pattern having the latter configuration is within the scope of the present invention.

FIG. 8 is a plan view illustrating a structure for each PCB unit 100a obtained after forming a slit 10a at the structure of FIG. 5 or 6 to remove the conductive bus line 11 (FIGS. 5 and 6) and forming a plated through hole 12a at the second mold runner gate 1b, in order to conduct an open/short circuit test for the printed circuit patterns of individual PCB units 100a. Since the structure of FIG. 8 is basically identical to the structure of FIG. 5 or 6, the following description will be made only in conjunction with different elements.

In order to enable the open/short circuit test for each of the PCB units 100a, it is necessary to remove the conductive bus line 11 and conductive traces 15 (FIGS. 4, 5, 7A, and 7B) arranged at a region outside each PCB unit 100a. To this end, the slots Sa and slits 10a are perforated in accordance with a punching or routing process, thereby electrically disconnecting the conductive traces 15 from one another.

The through hole 12a is selectively formed along the through hole forming line 12 (FIG. 5) in accordance with the punching or routing process. The through hole 12a may be plated with gold, platinum, palladium, silver, or an alloy thereof at its inner wall surface in order to easily remove the cured surplus encapsulating resin from the inner wall surface. The plating for the through hole 12a may be conducted simultaneously with the plating for the mold runner gates 1a and 1b or conductive circuit patterns so that they can be achieved using a single plating process. That is, the formation of the through hole 12a is conducted prior to the plating for the mold runner gates 1a and 1b or conductive circuit patterns. The deculling process can be easily carried out by upwardly punching the cured surplus resin existing in the through hole 12a using a punching pin (not shown). Of course, the present invention is not limited to such a configuration using the through hole 12a. For example, the deculling process can be achieved without the provision of the through hole 12a. That is, the deculling process can be carried out by upwardly punching the cured surplus resin existing at a region, where the slit 10a defined by the slit forming line 10 (FIG. 6) surrounding the conductive bus line 11 is to be formed, by use of a punching pin, while perforating the slit 10a. In order to prevent the cured surplus resin from being cut during the deculling process, an enlarged slit portion 10b may be provided at the central portion of the slit 10a.

As apparent from the above description, the present invention provides a matrix type PCB for semiconductor packages having a structure including a plurality of PCB units arranged in a matrix array having at least two rows in such a fashion that the mold runner gates of adjacent PCB units respectively arranged in adjacent rows while being arranged in the same column communicate with each other by an integrate mold runner, thereby being capable of allowing an increased number of PCB units to be simultaneously processed in each process involved in the fabrication of semiconductor packages, so that a great improvement in productivity is achieved. In particular, it is possible to allow an increased number of PCB units to be simultaneously molded in a resin encapsulate molding process, thereby achieving a great improvement in the efficiency of the resin encapsulate molding process. Furthermore, surplus encapsulating resin materials cured in the mold runner gates and integrate mold runners can be easily and reliably removed in accordance with a degating and/or deculling process without a surface damage of the PCB. It is also possible to achieve an easy open/short circuit test for individual PCBs.

Although various embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A matrix type printed circuit board for semiconductor packages comprising:
   resin substrate having a rectangular shape provided with two parallel longer edges and two parallel shorter edges;
   a plurality of printed circuit board (PCB) units formed on at least one surface of the resin substrate and arranged in a matrix array having at least two rows, each of the PCB units having a semiconductor chip mounting region at a central portion thereof;
   a plurality of first mold runner gates each formed at one corner of an associated one of the PCB units included in a first one of the at least two rows arranged adjacent to a first one of the longer edges of the resin substrate, the one corner being arranged adjacent to the first longer edge of the resin substrate;
   a plurality of second mold runner gates each formed at one corner of an associated one of the PCB units included in a second one of the at least two rows arranged adjacent to the first-row PCB units, the one corner of each PCB unit included in the second row being arranged nearest to the first mold runner gate of an associated one of the PCB units arranged in the first row and in the same column as the second-row PCB unit; and
   a plurality of first integrate mold runners each connected between the first and second mold runner gates of adjacent ones of the PCB units respectively arranged in the first and second rows while being arranged in the same column.

2. The matrix type printed circuit board of claim 1, wherein the matrix array of the PCB units has three rows, and further composing:
   a plurality of third mold runner gates each formed at one corner of an associated one of the PCB units included in the third row, the one corner of each PCB unit included in the third row being arranged nearest to the second mold runner gate of an associated one of the PCB units arranged in the second row and in the same column as the third-row PCB unit; and
   a plurality of second integrate mold runners each extending straight between the second and third mold runner gates of adjacent ones of the PCB units respectively arranged in the second and third rows while being arranged in the same column.

3. The matrix type printed circuit board of claim 1, wherein the matrix array of the PCB units has four rows, and further comprising:

a plurality of third mold runner gates each formed at one corner of an associated one of the PCB units included in a third one of the rows arranged adjacent to a second one of the longer edges of the resin substrate, the one corner being arranged adjacent to the second longer edge of the resin substrate;

a plurality of fourth mold runner gates each formed at one corner of an associated one of the PCB units included in a fourth one of the rows arranged adjacent to the third-row PCB units, the one corner of each PCB unit included in the fourth row being arranged nearest to the third mold runner gate of an associated one of the PCB units arranged in the third row and in the same column as the fourth-row PCB unit; and a plurality of second integrate mold runners each extending straight between the third and fourth mold runner gates of adjacent ones of the PCB units respectively arranged in the third and fourth rows while being arranged in the same column.

4. The matrix type printed circuit board of claim 1, further comprising:

a solder mask formed on the surface of the resin substrate in such a fashion that it is partially open to expose the first and second mold runner gates and the first integrate mold.

5. The matrix type printed circuit board of claim 1, further comprising:

a plurality of conductive bus lines each connected between the first and second mold runner gates of adjacent ones of the PCB units respectively arranged in the first and second rows while being arranged in the same column each of the conductive bus lines being arranged within an associated one of the first integrate mold runners.

6. The matrix type printed circuit board of claim 1, wherein each of the second mold runner gates has a deculling through hole.

7. The matrix type printed circuit board of claim 5, further comprising:

a plurality of uniformly spaced conductive traces extending across each of the conductive bus lines; and a plurality of deculling dummy structures extending across each of the conductive bus lines in parallel to the conductive traces associated with the conductive bus line between the first and second mold runner gates associated with the conductive bus line in such a fashion that each of the associated conductive traces is interposed between adjacent ones of the deculling dummy structures.

8. The matrix type printed circuit board of claim 5, further comprising:

a plurality of uniformly spaced conductive traces extending across each of the conductive bus lines; and a plurality of deculling dummy structures extending in parallel to each of the conductive bus lines between the first and second mold runner gates associated with the conductive bus line in such a fashion that each of the associated conductive traces is interposed between adjacent ones of the deculling dummy structures.

9. The matrix type printed circuit board of claim 5, further comprising:

plurality of slit forming lines each formed between the first and second mold runner gates associated with one of the conductive bus lines and adapted to form a slit for removing the conductive bus line, the slit being arranged within an associated one of the integrate mold runner.

10. The matrix type printed circuit board of claim 6, wherein the deculling through hole is plated at an inner wall surface thereof with a metal selected from the group consisting of gold, platinum, palladium, silver, and alloys thereof.

11. The matrix type printed circuit board of claim 7, wherein the dummy structures are selected from the group of dummy traces and dummy plains.

12. The matrix type printed circuit board of claim 7, wherein each of the dummy structures is connected to an associated one of the conductive traces at one end thereof.

13. The matrix type printed circuit board of claim 9, wherein the slit has an enlarged slit portion at a central portion thereof.

14. The matrix type printed circuit board of claim 9, further comprising:

a solder mask coated on the surface of the resin substrate at a region surrounding the slit and adapted to prevent the conductive traces and/or dummy traces associated with the slit from being deformed during the formation of the slit.

15. A matrix type printed circuit board comprising;

a substrate having a rectangular shape;

a plurality of PCB units formed thereon, said PCB units arranged in rows and columns, each of the PCB units including a device mounting region;

a plurality of mold runner gates, wherein a mold runner gate is located at each PCB unit;

a plurality of integrate mold runners, wherein an integrate mold runner connects the mold runner gate of each PCB unit of a respective column and the mold runner gate of an adjacent PCB unit of the column;

a plurality of conductive bus lines each extending between the mold runner gates of adjacent PCB units of a respective column a plurality of conductive traces each extending across an integrate mold runner, wherein each PCB unit of a respective row is electrically connected to an adjacent PC unit of the row by a plurality of the conductive traces; and a plurality dummy conductive structures on the integrate mold runner adjacent to the conductive traces.

16. The matrix type printed circuit board of claim 15, wherein the mold runner gates and the integrate mold runners are at least partially exposed through a solder mask on said substrate.

17. A printed circuit board, comprising:

a substrate;

a plurality of device mounting regions arranged on said substrate;

a plurality of mold runner gates each located at an edge of an encapsulation region surrounding a respective device mounting region; and a plurality of integrate mold runners each connected between adjacent ones of said mold runner gates;

a plurality of conductive bus lines each coupled between adjacent mold runner gates, wherein each said conductive bus line is arranged along a respective integrate mold runner;

a plurality of conductive traces extending across each of said conductive bus lines; and a plurality of dummy traces interposed between adjacent ones of said conductive traces, wherein said dummy traces extend across each of said conductive bus lines and are parallel to said conductive traces.

18. The printed circuit board of claim 17, wherein said device mounting regions are arranged in a plurality of rows and a plurality of columns.

19. The printed circuit board of claim 17, further comprising a plurality of conductive traces coupled between adjacent device mounting regions and extending across each of said integrate mold runners, wherein said traces, said integrate mold runners, and said mold runner gates are at least partially exposed through a solder mask on said substrate.

20. The printed circuit board of claim 17, further comprising a solder mask formed on said substrate, wherein said mold runner gates and said integrate mold runners are at least partially exposed through said solder mask.

21. The printed circuit board of claim 17, further comprising:

plurality of conductive traces extending across each of said conductive bus lines; and a plurality of dummy traces interposed between adjacent ones of said conductive traces, wherein said dummy traces are parallel to said conductive bus lines and are coupled at least one end to at least one of said conductive traces.

22. The printed circuit board of claim 17, Her comprising a plurality of slit forming lines each formed between adjacent mold runner gates, wherein each said slit forming line is arranged along a respective integrate mold runner and is adapted to form a slit for removing a respective conductive bus line.

23. The printed circuit board of claim 17, further comprising:

a plurality of conductive traces coupled between adjacent device mounting regions; and a solder mask formed on said substrate, wherein said traces are at least partially exposed through said solder mask.

24. The printed circuit board of claim 23, filter comprising a plurality of slot forming lines each formed along sides of said encapsulation regions not occupied by said integrate mold runners, wherein each said slot forming line is adapted to form a slot for removing portions of said traces that are at least partially exposed through said solder mask.

25. A method of making an integrated circuit package, the method comprising:

providing a rectangular substrate having a plurality of PCB units formed in rows and columns thereon, a plurality of mold runner gates, and a plurality of integrate mold runners, wherein a mold runner gate is at each PCB unit and an integrate mold runner connects the mold runner gate of each PCB unit and the mold runner gate of an adjacent PCB unit of a respective column of PCB units so that each PCB unit of the respective column is interconnected;

mounting an integrated circuit on each PCB unit;

molding a package body over each integrated circuit using a resin material, wherein the resin material flows over the integrate mold runner between the mold runner gates of the PCB units of a column; and singulating molded packages from the substrate.

26. The method of claim 25, further comprising forming an aperture through the integrate mold runner.

27. The integrated circuit package produced by the method of claim 25.

28. The method of claim 25, further comprising forming a plurality of conductive bus lines each extending between the mold runner gates of adjacent PCB units of a respective column.

29. The method of claim 25, further comprising forming a solder mask on the substrate, wherein the mold runner gates and the integrate mold runners are at least partially exposed through the solder mask.

30. The method of claim 25, further comprising forming conductive traces on the substrate between adjacent PCB units, the conductive traces extending across at least one of the integrate mold runners.

\* \* \* \* \*